HIGH SPEED DIGITAL PHASE MODULATION ENCODER

Filed Nov. 26, 1963 4 Sheets-Sheet 1

INVENTOR.
GLEN R. SOUTHWORTH
BY R. P. Campbell
ATTORNEY

May 21, 1968 G. R. SOUTHWORTH 3,384,823

HIGH SPEED DIGITAL PHASE MODULATION ENCODER

Filed Nov. 26, 1963 4 Sheets-Sheet 2

INVENTOR.
GLEN R. SOUTHWORTH
BY R. P. Campbell
ATTORNEY

HIGH SPEED DIGITAL PHASE MODULATION ENCODER

Filed Nov. 26, 1963 4 Sheets-Sheet 3

INVENTOR.
GLEN R. SOUTHWORTH
BY [signature]
ATTORNEY

HIGH SPEED DIGITAL PHASE MODULATION ENCODER

Filed Nov. 26, 1963 4 Sheets-Sheet 4

INVENTOR.
GLEN R. SOUTHWORTH
BY R. P. Campbell
ATTORNEY

United States Patent Office 3,384,823

Patented May 21, 1968

3,384,823

HIGH SPEED DIGITAL PHASE MODULATION ENCODER

Glen R. Southworth, Boulder, Colo., assignor to Ball Brothers Research Corporation, Boulder, Colo., a corporation of Colorado Filed Nov. 26, 1963, Ser. No. 326,084
8 Claims. (Cl. 325—38)

ABSTRACT OF THE DISCLOSURE

A high speed digital phase modulation encoder wherein the oscillations of a flip-flop circuit are modulated in 180° increments by modulating the amplitude of timing pulses with the output from a comparator circuit receiving an input signal and an integrated output from the flip-flop circuit. A second flip-flop circuit can also be provided with gated inputs controlled by the timing pulses, the output from one said gate providing the output to an integrator to produce pulse trains free of undesirable modulations.

This invention relates to a pulse code modulation system and pulse transmission circuit, and particularly to a delta modulation system for converting analog signals, especially wide band television signals, to digital pulse signals at extremely high rates, such as are required for high resolution television signals.

In simple delta modulation encoders, an analog input signal is quantized or converted into a train of pulses of equal amplitude, width, and timing. When the input signal is above a certain level, these pulses are generated; when it is below this level, the pulses are absent. Once generated, the pulses are coupled into an integrating device such that a crude replica of the input waveform is reproduced. The resulting signal is inverted in phase from the original input signal. It is compared to the input signal to provide a form of inverse feedback. This feedback tends to compensate for gross nonlinearities in the encoder and to generate a more complex pulse train than would occur if the feedback were not present. In this manner, greater fidelity is achieved in the encoding process.

An essential characteristic of conventional delta modulation systems is the generation of a carrier wave which is produced by the hunting oscillations generated by the feedback loop. In its simplest form, this carrier wave represents a pattern of ones and zeros. A pattern of 101010 when no input signal is present, represents one of the most efficient modes of operation of a delta encoder because the carrier wave generated is at its highest frequency, and a maximum bandwidth of modulation can be used.

When very high speed operation is attempted with a delta encoder, such as would be required for the encoding of television signals, several problems become increasingly serious. The first of these is the fact that loop delays produced by the encoder circuitry may be such that it is difficult to generate the desired 101010 pattern and the encoder may tend to operate in a 11001100 pattern, a 111000111000 pattern, etc., with the result that even though a high clock rate is used, the carrier generated by the encoder occurs at a lower rate, with consequently greatly diminished efficiency. A second problem is due to the fact that, at very high speed operation it becomes increasingly difficult to generate clean, unmodulated pulses in the analog-to-digital conversion process. If the pulses fed into the encoder integrator are modulated in any way, such as width, amplitude, or timing, this modulation causes errors in the reconstruction of the input signal. As a result, the encoding that takes place is not completely valid.

Thus, the basic problem involved, is encoding wide band television signals in real time, retaining as much information as possible, while at the same time generating a code with the lowest bit rate that is practical. Subsidiary problems involve minimizing unwanted spurious signals in the reproduction, producing stable circuitry, eliminating analog components that might affect the reconversion process, and improving detail contrast and edge rendition. In addition, very high speed circuitry is required to generate encoded pulses at a rate of thirty megabits or greater.

Various prior art differential signal transmission circuits, which have been proposed, rely upon the establishment of oscillations throughout the entire encoder loop, which includes several different, individual circuit elements such as, for example, the encoder shown in U.S. Patent No. 2,816,267. This arrangement has the inherent disadvantage that the desired carrier wave frequency or pattern of 101010, cannot be obtained at the encoder output if the encoder feedback loop is opened, and the encoder cannot be made to operate at the extremely high pulse rates in the most favorable 101010 operating mode without the necessify of employing a critical and carefully controlled feedback loop.

Accordingly, it is an important object of this invention to provide a delta pulse code modulation system for transmission of signals, such as wide band television signals, by the use of an encoder wherein oscillations are established in only one of the several different, individual circuit elements in the encoder loop.

Another object of this invention is to provide a pulse code modulation system of improved stability and practicality of operation at the extremely high rates required for high fidelity encoding and pulse transmission of high resolution television signals.

Additional objects and various features and advantages of the invention will become apparent from the following description, which is given primarily for purposes of illustration, and not limitation.

Stated in general terms, the objects of this invention are attained by providing a delta pulse code modulation system wherein most of the necessary oscillations for operation of the system are produced primarily within a single, individual circuit element in the encoder loop. As a result the maximum carrier wave frequency, or pattern of 101010, can be obtained at the encoder output, even when the encoder feedback loop is completely disconnected from the encoder. Consequently, the encoder can be made to operate at extremely high pulse rates, in the favorable 101010 operating mode, without the necessity of including a critical and carefully controlled feedback loop in the encoder loop.

The oscillations preferably are produced by the use of a local oscillator, such as a flip-flop circuit, which is phase modulated in increments of 180° by the resultant of the sum of the analog input voltage to the encoder and the loop feedback voltage of the encoder loop. Such a system can be made to encode as rapidly as the flip-flop circuit can be made to operate, and is inherently more rapid than in prior art systems where the necessary oscillations of the system are established throughout the entire encoder loop circuitry. In addition to high speed operation, the preferred system of the invention operates at improved stability due to the localized action of the flip-flop circuit. Furthermore, in this system the loop feedback can be far below the critical value, if desired, while maximum frequency of oscillations is maintained in the feedback circuit. Also, a distinguishing feature of the preferred system of the invention resides in the amplitude of trigger pulses applied to the two sides of the flip-flop circuit. If these are set just below the point of sufficient amplitude to trigger the flip-flop circuit, the pulse code modulation circuit can be considered as a highly efficient form of delta encoder employing a symmetrically triggered decision element. Conversely, if the trigger pulse amplitude is just above the level required to trigger the flip-flop circuit, the encoder circuit can be considered as an advanced form of digital phase modulation encoder.

A more detailed description of specific embodiments of the invention is given below with reference to the accompanying drawings, wherein:

FIGURE 1 is a schematic block diagram showing a high speed digital phase modulation encoder;

FIGURES 2(A) and 2(B) are graphs schematically showing, respectively, the sine wave input to the quantizer in normal operation, and the digital output from the quantizer when the feedback loop of the encoder system is disconnected;

Figure 1:
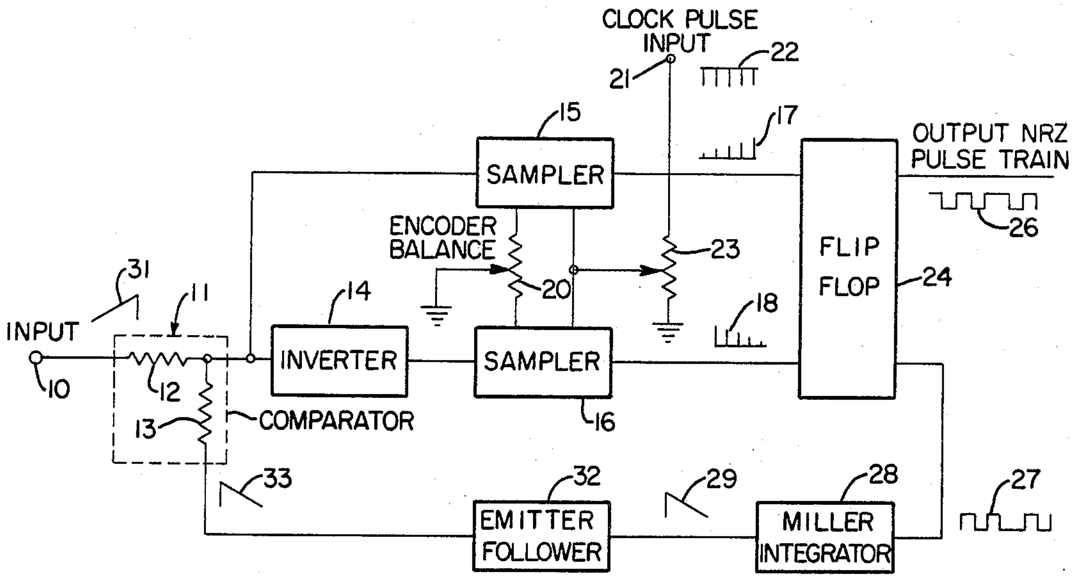

Referring to FIGURE 1, the analog signal input is shown at 10 and the comparator circuit is indicated at 11. Comparator circuit 11 consists of a simple resistive matrix including resistors 12 and 13. Inverter 14 serves the purpose of inverting the differential signal produced by comparator 14. Samplers 15 and 16 take the two out-of-phase differential signals and convert them to a series of amplitude modulated pulses as indicated at 17 and 18, respectively. The variable resistor 20 is used to adjust the relative amplitudes of samplers 15 and 16 for either balance or asymmetry, as will be described more fully hereinbelow. The clock pulse input 21 accepts a series of very narrow, equally-spaced, equal ampltiude pulses indicated at 22, from a clock pulse generator. Clock pulses 22 are controlled in amplitude by potentiometer 23 and are then coupled into samplers 15 and 16. The outputs 17 and 18 of samplers 15 and 16, respectively, are two pulse trains wherein the pulses are of the same polarity, but the modulation superimposed on these pulses is of opposite phase.

These two pulse trains 17 and 18 actuate a flip-flop circuit 24, which generates a series of squarewaves indicated at 26. Squarewaves 26 represent a digital non-return-to-zero output pulse train. Pulses of inverted phase, indicated in a wave at 27, are taken from the other side of flip-flop circuit 24 and applied to the input of a Miller-type integrator 28. The output indicated at 29, of integrator 28 is a reconstructed version of the input signal 31, but is of opposite phase as shown at 29. Signal 29 is coupled into emitter follower 32, for impedance matching purposes. Emitter follower 32 also drives one leg 13 of comparator 11 thus completing the inverse feedback loop.

Figure 2:
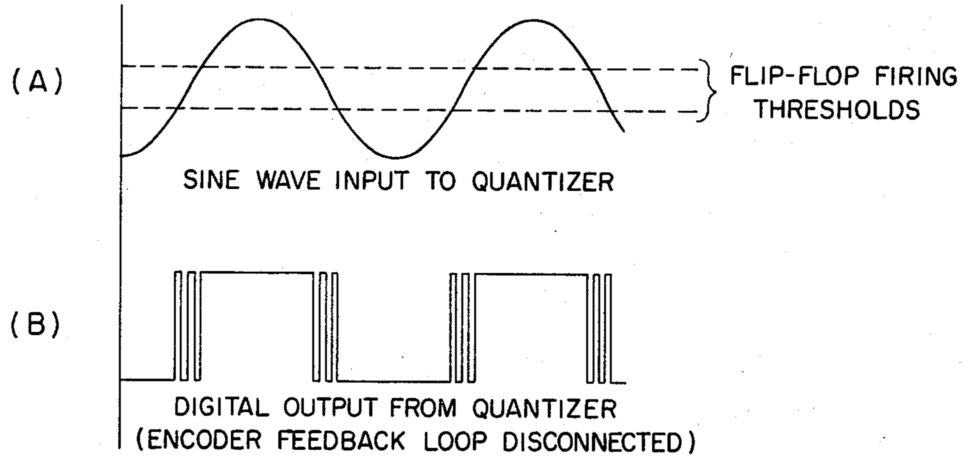

In one mode of operation, the encoder balance control 20 is adjusted so that the pulse train output 17 of sampler 15 and output 18 of sampler 16 are identical in height. With no input signal to the encoder, clock pulse amplitude potentiometer 23 is adjusted so that sufficient output from samplers 15 and 16 occurs to continuously trigger flip-flop circuit 24 to produce a carrier wave pattern of 101010. This pattern would still be generated even if the feedback loop were broken, for example, between integrator 28 and follower 32, because the oscillation of flip-flop circuit 24 is not dependent upon the overall feedback loop. A signal applied at input 10 now will cause the outputs 17 and 18 of samplers 15 and 16, respectively, to be modulated out of phase. Flip-flop circuit 24 now acts as a dual comparator, remaining in one state when the pulse output 17 from sampler 15 is too low to trigger the input side of flip-flop circuit 24, such as would be accomplished by negative modulation of sampler 15 by the input signal. A change to the opposite state occurs when the pulse output 17 from sampler 15 increases past the triggering level of flip-flop circuit 24, and sampler 16 decreases below the triggering level, as would be the case if the polarity of the input signal changed. If the encoder feedback loop were disabled, the output of flip-flop circuit 24 would now represent a series of square-waves 26 bearing a relationship to the input signal 31, shown as a sine wave in FIGURE 2(A), but with a series of high frequency oscillations occurring at or near zero crossings of the input signal of FIGURE 2(A), as shown in FIGURE 2(B). Completion of the feedback loop causes comparison to take place at comparator 11, with the result that the output pulse train 26 is modified in a delta modulation manner.

Two other modes of operation can be achieved with the circuit of FIGURE 1. By reducing the amplitude of clock pulses 22 fed into samplers 15 and 16 by means of clock pulse amplitude potentiometer 23, the encoder can be adjusted so that flip-flop circuit 24 does not oscillate when the encoder loop is opened. Under this condition, the encoder can be made to operate more like a conventional delta modulation encoder. Feedback energy in comparison signal 33 from emitter follower 32 may be sufficient to positively modulate either sampler 15, or sampler 16, thus causing flip-flop circuit 24 to change state. Depending upon the loop delay encountered and the adjustment of clock pulse amplitude potentiometer 23, oscillations of 101010, 11001100, 111000111000, or larger, may be established, although normally patterns other than the 101010 combinations are considered to be less efficient.

Readjustment of encoder balance control variable resistor 20 may also be used to provide asymmetric delta, or phase modulation, encoding, depending upon the setting of clock pulse amplitude potentiometer 23. Asymmetric encoding allows the establishment of patterns, such as 100100 or 001001, etc., from the encoder when no signal input is present. Such encoding is useful in certain instances in uncovering fine detail in the input signal.

Figure 3:
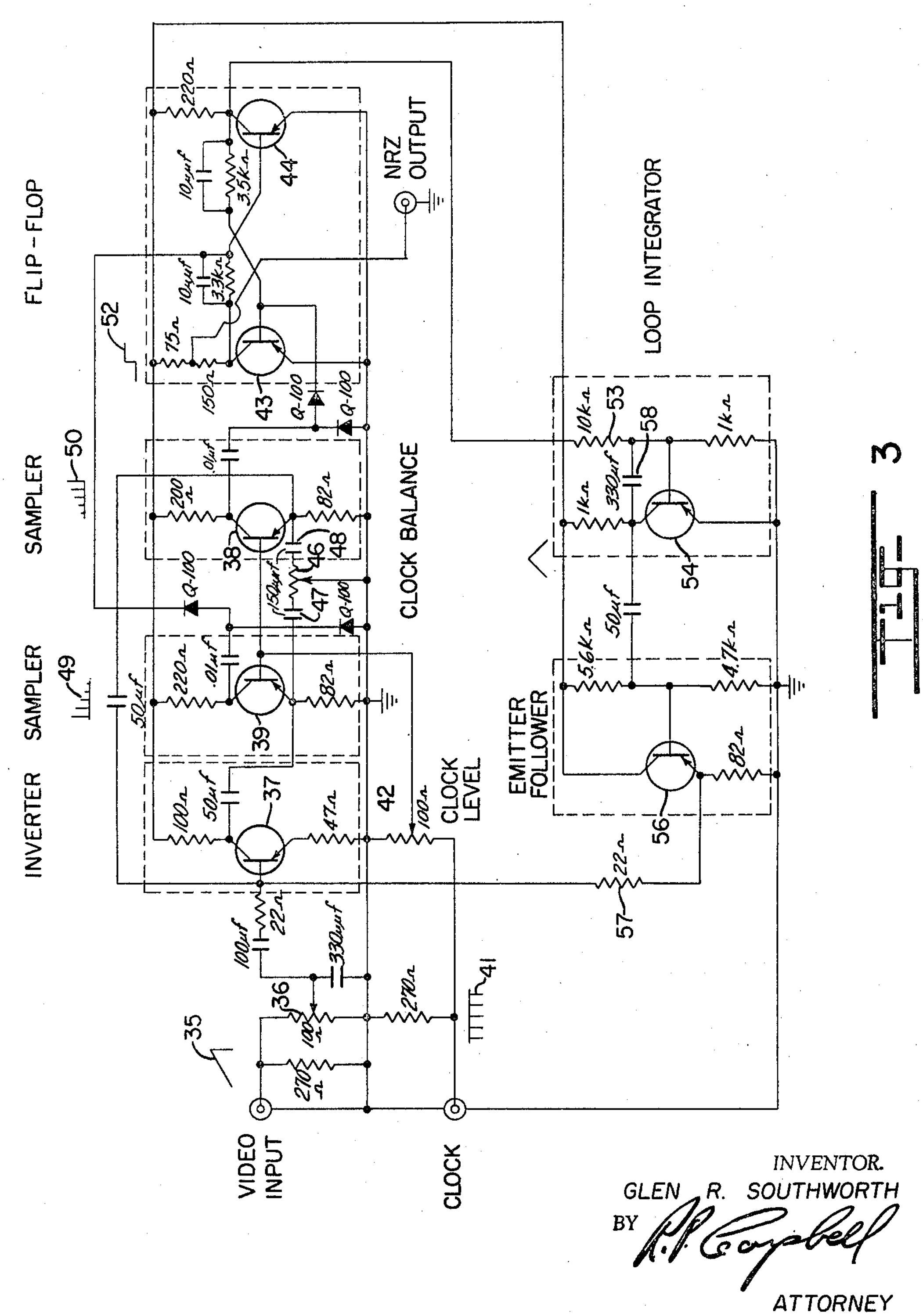
FIGURE 3 is a schematic circuit diagram showing a high speed digital phase modulation encoder according to the invention.

An actual embodiment of a high speed phase modulation encoder of the invention is shown in FIGURE 3. This embodiment of the invention is intended for the efficient encoding of very wide band television signals. The incoming video signal 35 is applied to a gain control potentiometer 36. It is then coupled into the base of inverting transistor 37 which is coupled into the emitter of sampling transistor 39. Negative-going clock pulses 41 are applied to potentiometer 36, the center leg of which feeds the bases of both sampling transistors 38 and 39. Normally, clock pulse amplitude potentiometer 42 is set so that, with no video input, sufficiently large pulses appear on the collectors of sampling transistors 38 and 39 to trigger the high speed flip-flop circuit, including transistors 43 and 44, in such a manner as to produce continuous oscillations. Variable resistor 46, in conjunction with two small capacitors 47 and 48, is used to adjust the amount of high frequency degeneration in sampling transistors 38 and 39, thus balancing the relative pulse amplitudes 49 and 50 from these two samplers. The output of transistor 44 consists of an NRZ pulse train 52, which is coupled through resistor 53 to the base of transistor 54, which acts as a Miller feedback integrator. The output of transistor 54 is coupled to emitter follower transistor 56, which acts as an impedance matching device. The output of transistor 56 is fed through a small matrixing resistor 57, back into the input of inverting transistor 37, and the emitter of sampling transistor 38, thus closing the feedback loop. As shown, an NRZ output digital pulse train 52 may be taken directly from the collector of flip-flop circuit transistor 43 for utilization.

The circuit shown in FIGURE 3 has been operated successfully to above 35 megabits per second in symmetrical, non-symmetrical, delta, and phase modulation modes. At high speeds some deformation or modulation of the pulse train 52 out of flip-flop circuit of transistors 43 and 44 may occur. The deleterious effects of this distortion can be minimized by keeping the value of capacitor 58 low, thus preventing accumulation of a large error voltage.

Figure 4:
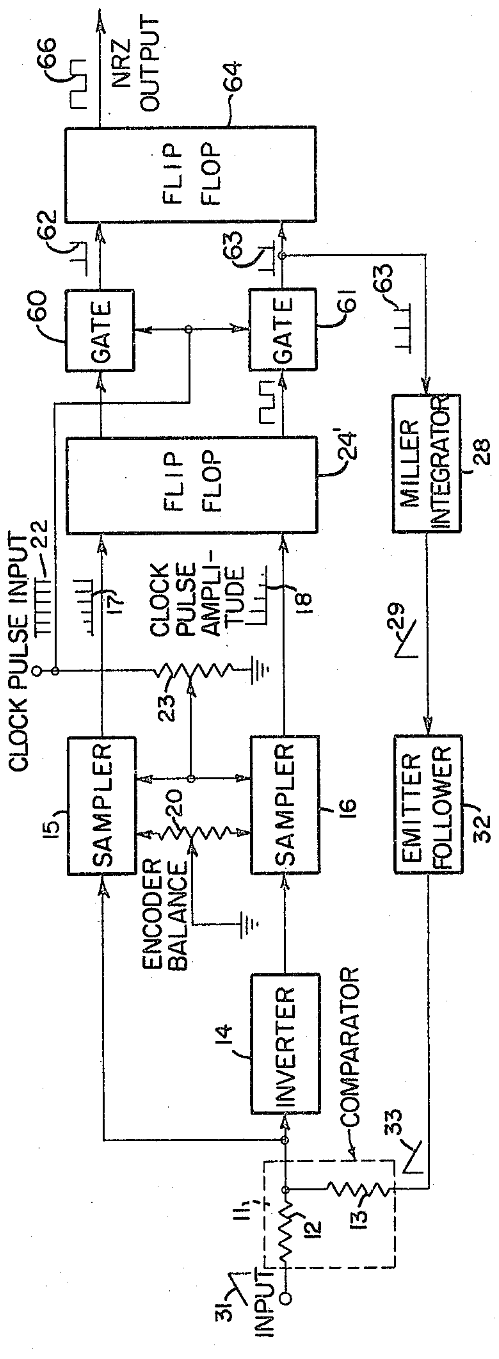
FIGURE 4 is aschematic block diagram showing a high speed digital phase modulation encoder in which reclocking is used in the encoder loop to eliminate the effects of analog modulation on the pulse stream.
Figure 5:
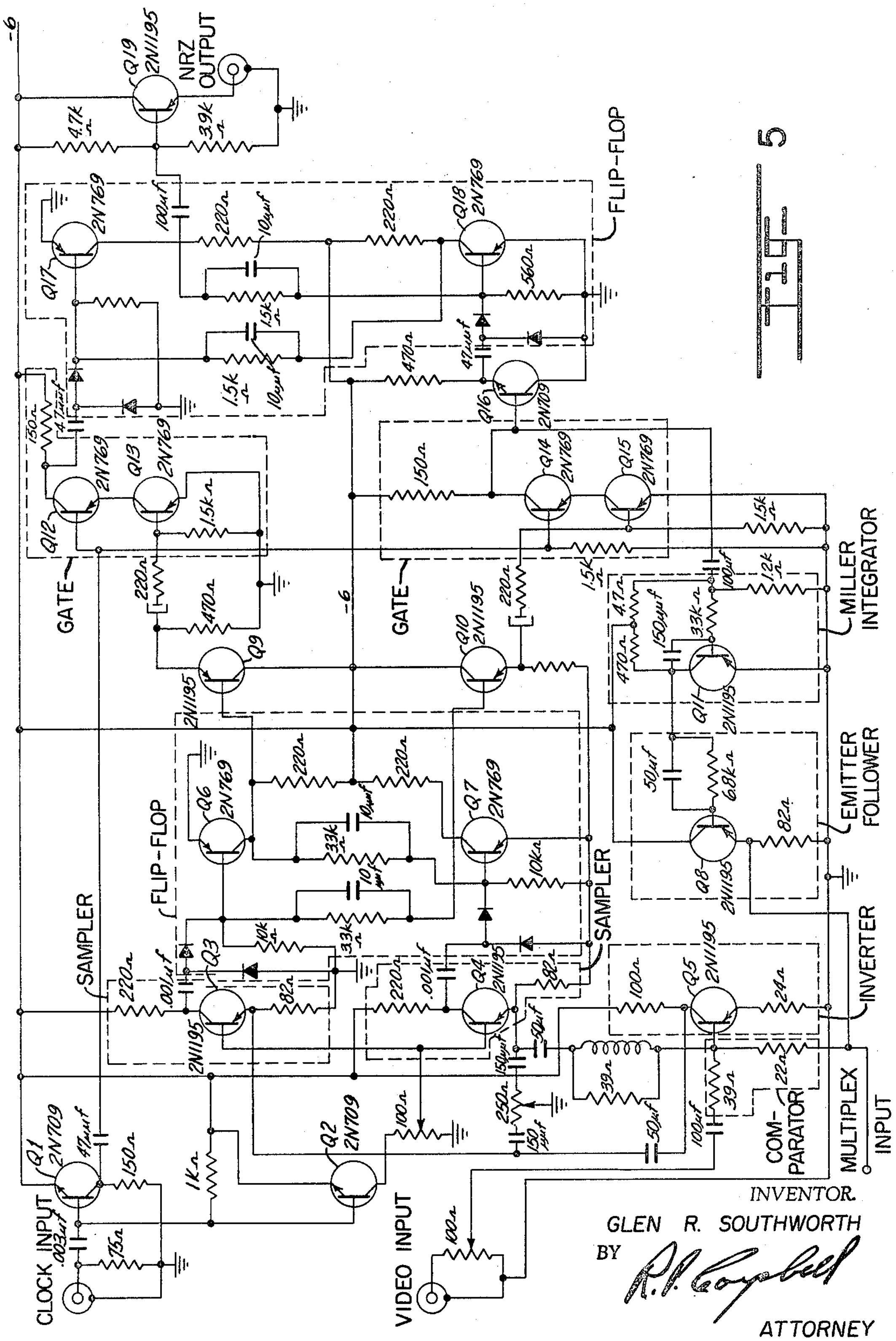
FIGURE 5 is a schematic circuit diagram showing circuit details of the encoder of FIGURE 4.

FIGURE 4 shows a block diagram of a second embodiment of the invention in which reclocking is used in the encoder loop to eliminate the effects of analog modulation of the pulse stream. In this embodiment, the NRZ squarewave pulse trains 26 and 27 (FIGURE 1) from the flip-flop circuit 24' (FIGURE 4) are used to drive two gates 60 and 61, which generate narrow clock pulses 62 and 63, respectively, in their outputs. The outputs 62 and 63 of these two gates 60 and 61, respectively, are used to drive a second flip-flop circuit 64 providing a clean NRZ signal 66 for transmission purposes. The pulse output 63 of gate 61 also is used to drive the Miller-type integrator 28 in the encoder feedback loop. It is important to note that this series of narrow asymmetrical pulses 63 is sufficient to adequately reproduce the input waveforms 31, and produce a satisfactory comparison signal 33. The complete circuit diagram of an actual embodiment of this system is shown in FIGURE 5. This embodiment of the invention shown in FIGURE 5, has been successfully operated at rates as high as 45 megabits.

Figure 6:
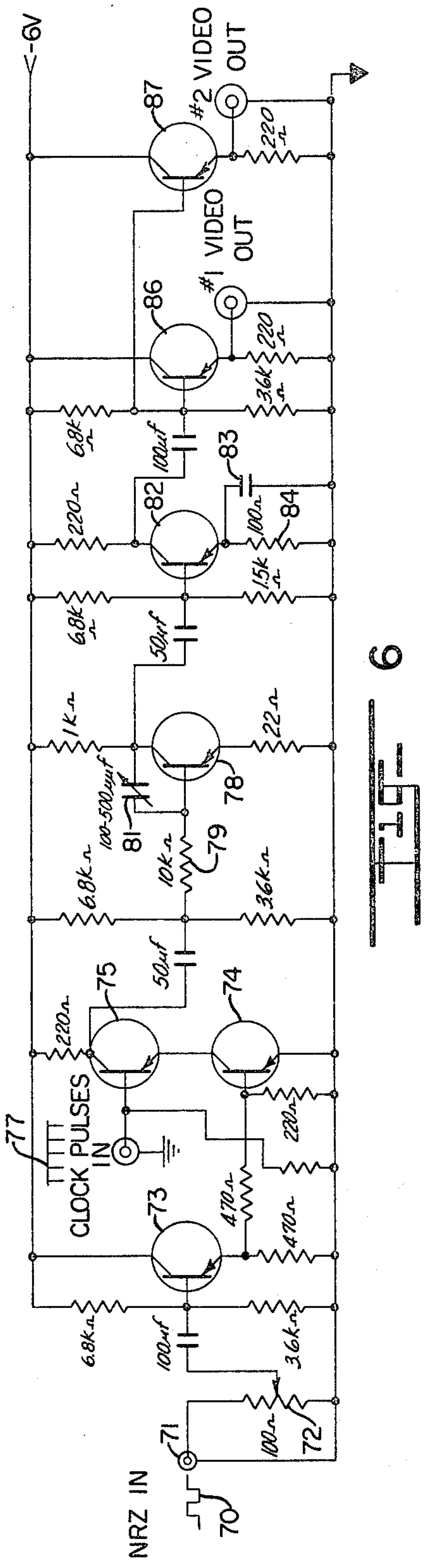
FIGURE 6 is a schematic circuit diagram showing a decoder which can be used with the encoders of FIGURES 1 and 3 to 5.

FIGURE 6 shows a circuit diagram of a decoder which can be used with the previously discussed phase modulation encoders of FIGURES 1 and 3 to 5. A digital NRZ signal 70 is applied to the input 71 of the decorder through gain control potentiometer 72. Transistor 73 acts as an emitter follower which drives the bottom half of a gate comprised of transistors 74 and 75. Appropriately-phased negative clock pulses 77 are fed into the base of transistor 75 with the result that a clean, retimed pulse train is obtained at the collector of the transistor. This retimed pulse train is then applied to the base of transistor 78 through resistor 79 with variable capacitor 81 being adjusted to match the time constants to that of the integrator 28 (FIGURE 1) of the transmitter. The output of transistor 78 is coupled to the base of transistor 82 which acts as an inverting amplifier. Capacitor 83 across the emitter resistor 84 of transistor 82 may be chosen to compensate for the differential rise time characteristics of the delta code to provide superior rise time and enhanced detail contrast in television images. Typically, the value of this capacitor may be between .001 and .005 microfarad for wide band television signals. The output of transistor 82 is then coupled into the bases of transistors 86 and 87, which are emitter followers driving standard 75 ohm video distribution lines.

It will be understood that the above described specific embodiments are illustrative of the application of the principles of the invention. Also, it should be apparent that the outlined objectives of this invention are achieved by the specific embodiments disclosed and described. Numerous other modifications and variations of the present invention may be devised by those skilled in the art, within the scope of the appended claims, without departing from the spirit of this invention.

What is claimed is:

1. A pulse code modulation system comprising: means for continuously producing a series of timing pulses; circuit oscillating means for continuously producing oscillations at a rate determined by the timing pulses; means for continuously controlling the amplitude of the timing pulses; a pair of sampler means for continuously receiving the amplitude controlled timing pulses, said pair of sampler means being adapted for each producing a pulse train wherein the corresponding pulses of each train are of like polarity but the modulation superimposed on the corresponding pulses of each pulse train are of opposite phase, and the two pulse trains being effective to continuously actuate the circuit oscillating means to continuously generate a series pair of waves; integrator means coupled to the circuit oscillating means for continuously receiving pulses of inverted phase from one of the pair of waves of the circuit oscillating means and for continuously reproducing a substantial replica of a waveform continuously fed into the system but of opposite phase; comparator means for continuously receiving the replica waveform from the integrator means for continuously comparing said reproduced replica with the original input waveform continuously fed into the system through the comparator means; means for continuously feeding the output differential signal of the comparator means to one of the pair of sampler means; means connected to the comparator and the other of the pair of samplers for inverting the output differential signal of the comparator means; said sampler means being adapted to continuously convert the two out-of-phase differential signals into a series of amplitude modulated pulses; and means coupled to said sampler means for selectively balancing and unbalancing the pair of sampler means as desired.

2. A pulse code modulation system comprising: input means for receiving a series of timing pulses; circuit oscillating means for continuously producing oscillations at a rate determined by received timing pulses; a pair of sampler means for continuously receiving the timing pulses from the input means, said pair of sampler means being adapted for each producing a pulse train wherein the corresponding pulses of each train are of like polarity but the modulation superimposed on the corresponding pulses of each pulse train are of opposite phase, and the two pulse trains being effective to continuously actuate the circuit oscillating means to continuously generate a series pair of waves; means coupled to the circuit oscillating means for continuously receiving pulses of inverted phase from one of the pair of waves of the circuit oscillating means and for continuously reproducing a substantial replica of a waveform continuously fed into the system but of opposite phase; comparator means for continuously receiving the replica waveform from the last named means for continuously comparing said reproduced replica with the original input waveform continuously fed into the system through the comparator means; means for continuously feeding the output differential signal of the comparator means to one of the pair of sampler means; means connected to the comparator and the other of the pair of samplers for inverting the output differential signal of the comparator means, said sampler means being adapted to continuously convert the two out-of-phase differential signals into a series of amplitude modulated pulses; and means coupled to said sampler means for selectively balancing and unbalancing the pair of sampler means as desired.

3. A pulse code modulation system, comprising: timing pulse input means for receiving a series of timing pulses; flip-flop circuit oscillating means for continuously producing oscillations at a rate determined by the timing pulses; a pair of sampler means each having first and second inputs, said first inputs for continuously receiving timing pulses from said timing pulse input means, said pair of sampler means being adapted for each producing a pulse train wherein the corresponding pulses of each train are of like polarity but modulation superimposed on the corresponding pulses of each pulse train are of opposite phase, the two pulse trains being adapted to continuously actuate the flip-flop circuit oscillating means to produce a series pair of outputs; integrator means coupled to the flip-flop circuit oscillating means for continuously receiving pulses of inverted phase therefrom and for continuously reproducing a substantial replica of a waveform continuously fed into the system but of opposite phase; comparator means coupled to the integrator means for continuously receiving the replica waveform therefrom and comparing the same with the original input waveform continuously received at the comparator means; and means for continuously feeding the output differential signal of the comparator means to the second inputs of said sampler means with the differential signal received by one of said sampler means being inverted with respect to the differential signal received by the other, said output differential signal modulating the amplitude of said timing pulses received at the first inputs of said sampler means so that the amplitude of the pulses coupled to said flip-flop circuit oscillating means from said sampler means has substantially the same amplitude as the amplitude of the differential signals received at the second inputs thereof and which pulses from said sampler means may be incrementally varied with respect to one another between predetermined limits as determined by the differential output signal coupled to the sampler means.

4. A pulse code modulation system comprising: means for continuously producing a series of timing pulses; first circuit oscillating means for continuously producing oscillations at a rate determined by the timing pulses; means for continuously controlling the amplitude of the timing pulses; a pair of sampler means for continuously receiving the amplitude controlled timing pulses, said pair of sampler means being adapted for each producing a pulse train wherein the corresponding pulses of each train are of like polarity but the modulation superimposed on the corresponding pulses of each pulse train are of opposite phase, and the two pulse trains being adapted to continuously actuate said first circuit oscillating means to continuously generate a series pair of waves; a pair of gate means for receiving said pair of waves from said first circuit oscillating means and continuously generating narrow clock pulses in their outputs thus reclocking the pulse trains to produce a pair of pulse trains free from undesirable modulations; second circuit oscillating means for receiving the reclocked outputs thereof for driving the second circuit oscillating means to produce a clean output signal; integrator means coupled to one of the gate means to be driven by the output signal of said gate means so that the integrator means continuously reproduces a substantial replica of a waveform continuously fed into the system; comparator means for continuously receiving the replica waveform from the integrator means and for continuously comparing said reproduced replica with the original input waveform continuously fed into the system through the comparator means; means for continuously feeding the output differential signal of the comparator means to one of the pair of sampler means; means connected to the comparator and the other of the pair of samplers for inverting the output differential signal from the comparator means, said sampler means being adapted to continuously convert the two out-of-phase differential signals into a series of amplitude modulated pulses; and means coupled to said sampler means for selectively balancing and unbalancing the pair of sampler means as desired.

5. A pulse code modulation system comprising: input means for receiving a series of timing pulses; first circuit oscillating means for continuously producing oscillations at a rate determined by the received timing pulses; a pair of sampler means for continuously receiving the timing pulses from the input means, said pair of sampler means being adapted for each producing a pulse train wherein the corresponding pulses of each train are of like polarity but the modulation superimposed on the corresponding pulses of each pulse train are of opposite phase, and the two pulse trains being effective to continuously actuate the circuit oscillating means to continuously generate a series pair of waves; a pair of gate means for receiving said pair of waves from said first circuit oscillating means and continuously generating narrow clock pulses in their outputs thus reclocking the pulse trains to produce a pair of pulse trains free from undesirable modulations; second circuit oscillating means for receiving the reclocked outputs thereof for driving the second circuit oscillating means to produce a clean output signal; means coupled to one of the gate means to be driven by the output signal of said gate means to continuously reproduce a substantial replica of a waveform continuously fed into the system but of opposite phase; comparator means for continuously comparing the reproduced replica waveform and the input waveform continuously fed into the system; means for continuously feeding the output differential signal of the comparator means to one of the pair of sampler means; means connected to the comparator and the other of the pair of samplers for inverting the output differential signal from the comparator means, said sampler means being adapted to continuously convert the two out-of-phase differential signals into a series of amplitude modulated pulses; and means coupled to said sampler means for selectively balancing and unbalancing the pair of sampler means as desired.

6. A delta pulse code modulation encoding and decoding system which comprises an oscillating element for producing continuous oscillations at a rate determined by an applied timing pulse, means for modulating the continuous oscillations in increments of 180° by modulating the amplitude of the timing pulses applied to the oscillating element, an integration circuit coupled to the output of the oscillating element, means for comparing the output signal of the integration circuit with input analog signal information, means for coupling the resulting comparison signal to the timing pulse modulating means, and means for decoding a digital pulse train coupled to the output of the oscillating element including reclocking means for retiming the pulse train to substantially eliminate undesirable variations, integrating means for reconstructing the retimed pulse train to form an approximation of the said input analog signal information with appropriate time constants, amplifying means for amplifying the reconstructed signal together with compensation for the differential rise time characteristics inherent in the delta modulation process, and an impedance matching output stage for coupling the reproduced signal to an appropriate load.

7. A pulse code modulation system comprising means for continuously producing a series of timing pulses, flip-flop circuit oscillating means for continuously producing oscillations at a rate determined by the timing pulses, potentiometer means for continuously controlling the amplitude of the timing pulses, a pair of sampler means for continuously receiving the amplitude-controlled timing pulses, said pair of sampler means being adapted for each producing a pulse train wherein the corresponding pulses of each train are of like polarity but the modulation superimposed on the corresponding pulses of each pulse train are of opposite phase, and the two pulse trains are adapted to continuously actuate the flip-flop circuit oscillating means to continuously generate a series pair of squarewaves, integrator means coupled to the flip-flop circuit oscillating means for continuously receiving pulses of inverted phase from one of the pair of waves of the flip-flop means and for continuously reproducing a substantial replica of a waveform continuously fed into the system but of opposite phase, emitter follower means coupled to the integrator means for impedance matching purposes, comparator means coupled to the emitter follower means for continuously receiving the replica waveform from the integrator means for continuously comparing said reproduced replica with the original input waveform continuously fed into the system through the comparator means, means for continuously feeding the output differential signal of the comparator means to one of the two sampler means, inverter means coupled to the comparator means for continuously inverting the output differential signal of the comparator means and for continuously feeding its output signals to the other of the two sampler means, said sampler means being adapted to continuously convert the two out-of-phase differential signals into a series of amplitude modulated pulses and variable resistor means coupled between the pair of sampler means for selectively balancing and unbalancing the pair of sampler means as desired.

8. A pulse code modulation system comprising means for continuously producing a series of timing pulses, first flip-flop circuit oscillating means for continuously producing oscillations at a rate determined by the timing pulses, potentiometer means for continuously controlling the amplitude of the timing pulses, a pair of sampler means for continuously receiving the amplitude-controlled timing pulses, said pair of sampler means being adapted for each producing a pulse train wherein the corresponding pulses of each train are of like polarity but the modulation superimposed on the corresponding pulses of each pulse train are of opposite phase, and the two pulse trains are adapted to continuously actuate said first flip-flop circuit oscillating means to continuously generate a series pair of squarewaves, a pair of gate means coupled to said first flip-flop circuit oscillating means for respectively receiving one of the said pair of squarewaves and continuously generating narrow clock pulses in their outputs thus reclocking the digital pulse trains to produce a pair of pulse trains free from undesirable modulations, second flip-flop circuit means coupled to the pair of gate means for receiving the reclocked outputs thereof for driving the second flip-flop circuit means to produce a clean output signal, integrator means coupled to one of gate means to be driven by the output signal of said gate means and so that the integrator means continuously reproduces a substantial replica of a waveform continuously fed into the system, emitter follower means coupled to the integrator means, comparator means coupled to the emitter follower means for continuously receiving the replica waveform from the integrator means and for continuously comparing said reproduced replica with the original input waveform continuously fed into the system through the comparator means, means for continuously feeding the output differential signal of the comparator means to one of the two sampler means, inverter means coupled to the comparator means for continuously inverting the output differential signal of the comparator means and for continuously feeding its output signals to the other of the two sampler means, said sampler means being adapted to continuously convert the two out-of-phase differential signals into a series of amplitude modulated pulses, and variable resistor means coupled between the pair of sampler means for selectively balancing and unbalancing the pair of sampler means as desired.

References Cited

UNITED STATES PATENTS

| | | | |
|---|---|---|---|
| 2,720,133 | 10/1955 | Morgan | 331—11 X |
| 2,798,946 | 7/1957 | Howery et al. | 325—420 X |
| 2,816,267 | 12/1957 | De Jager et al. | 332—11 |
| 3,005,165 | 10/1961 | Lenigan | 331—11 |
| 3,173,092 | 3/1965 | Meschi | 325—38.1 |
| 3,249,870 | 5/1966 | Greefkes | 332—11 |

OTHER REFERENCES

"A Sampling Comparator," Arieh Fischmann Arbel, Electronic Engineering, December 1958, pp. 685–689.

ROBERT L. GRIFFIN, *Primary Examiner.*

JOHN W. CALDWELL, DAVID G. REDINBAUGH, *Examiners.*

W. S. FROMMER, *Assistant Examiner.*